(12) United States Patent
Yamazaki et al.

(10) Patent No.: US 10,837,345 B2
(45) Date of Patent: Nov. 17, 2020

(54) BLAST FAN

(71) Applicant: SANYO DENKI CO., LTD., Tokyo (JP)

(72) Inventors: Yoshihisa Yamazaki, Tokyo (JP); Satoshi Fujimaki, Tokyo (JP); Takashi Kawashima, Tokyo (JP); Souma Araki, Tokyo (JP)

(73) Assignee: SANYO DENKI CO., LTD., Tokyo (JP)

( * ) Notice: Subject to any disclaimer, the term of this patent is extended or adjusted under 35 U.S.C. 154(b) by 57 days.

(21) Appl. No.: 15/716,040

(22) Filed: Sep. 26, 2017

(65) Prior Publication Data
US 2018/0087440 A1    Mar. 29, 2018

(30) Foreign Application Priority Data

Sep. 29, 2016 (JP) ................. 2016-191989

(51) Int. Cl.
| F01P 5/04 | (2006.01) |
| F04D 19/00 | (2006.01) |
| F04D 29/54 | (2006.01) |
| F04D 29/66 | (2006.01) |
| H05K 7/20 | (2006.01) |

(52) U.S. Cl.
CPC ............ F01P 5/043 (2013.01); F04D 19/005 (2013.01); F04D 29/541 (2013.01); F04D 29/547 (2013.01); F04D 29/667 (2013.01); H05K 7/20145 (2013.01); *F05D 2250/292* (2013.01); *F05D 2250/711* (2013.01)

(58) Field of Classification Search
CPC ...... F01P 5/043; F04D 19/005; F04D 29/541; F04D 29/547; F04D 29/667

USPC .......................................................... 415/220
See application file for complete search history.

(56) References Cited

U.S. PATENT DOCUMENTS

| 3,334,807 A * | 8/1967 | McMahan ............. F04D 29/384 |
| | | 415/207 |
| 4,786,231 A | 11/1988 | Kelley |
| 6,254,343 B1 | 7/2001 | Schmidt et al. |
| 7,481,615 B2 * | 1/2009 | Park ...................... F04D 29/164 |
| | | 123/41.49 |

(Continued)

FOREIGN PATENT DOCUMENTS

| CN | 201891676 U | 7/2011 |
| JP | S59168300 A | 9/1984 |

(Continued)

OTHER PUBLICATIONS

Search Report dated Feb. 7, 2018 for the corresponding European Patent Application No. 17193944.0.

(Continued)

*Primary Examiner* — Moshe Wilensky
*Assistant Examiner* — Cameron A Corday
(74) *Attorney, Agent, or Firm* — Rankin, Hill & Clark LLP

(57) ABSTRACT

A blast fan includes: a tubular frame having a first opening and a second opening to pass airflow through between the first opening and the second opening. The first opening has a first reverse tapered portion expanding from inside to outside of the frame, and the first reverse tapered portion has a surface having first convex portions projecting to the inside of the frame.

5 Claims, 6 Drawing Sheets

(56) References Cited

U.S. PATENT DOCUMENTS

| | | | | |
|---|---|---|---|---|
| 8,113,775 | B2* | 2/2012 | Yoshida | F04D 25/0613 415/219.1 |
| 9,435,345 | B2* | 9/2016 | Otsuka | F04D 29/384 |
| 2005/0274497 | A1* | 12/2005 | Huang | F04D 29/667 165/121 |
| 2006/0257254 | A1 | 11/2006 | Ho et al. | |
| 2006/0286924 | A1 | 12/2006 | Milana | |
| 2007/0122278 | A1 | 5/2007 | Ho et al. | |
| 2007/0189892 | A1 | 8/2007 | Oguma | |
| 2008/0181764 | A1 | 7/2008 | Hirakawa | |
| 2008/0213103 | A1 | 9/2008 | Miyakoda | |
| 2008/0219837 | A1 | 9/2008 | Chang et al. | |
| 2015/0132121 | A1 | 5/2015 | Yuan | |
| 2016/0312792 | A1* | 10/2016 | Fujimaki | F04D 25/08 |

FOREIGN PATENT DOCUMENTS

| | | | |
|---|---|---|---|
| JP | 60-7573 | U | 1/1985 |
| JP | 2-185700 | A | 7/1990 |
| JP | 2006-316787 | | 11/2006 |
| JP | 2007218101 | A2 | 8/2007 |
| JP | 2009097430 | A * | 5/2009 |
| JP | 5832052 | B1 | 12/2015 |

OTHER PUBLICATIONS

Philippine Office Action dated Apr. 6, 2018 for the corresponding Philippine Patent Application No. 1-2017-000272.
European Office Action dated Dec. 18, 2018 for the corresponding European Patent Application No. 17193944.0.
Japanese Office Action (JPOA) dated Mar. 24, 2020 for the corresponding Japanese Patent Application No. 2016-191989.
Chinese Office Action (CNOA) dated Sep. 4, 2020 for the corresponding Chinese Patent Application No. 201710831289.5.

* cited by examiner

BLAST FAN

CROSS-REFERENCE TO RELATED APPLICATION

This application claims priority from Japanese Patent Application No. 2016-191989 filed with the Japan Patent Office on Sep. 29, 2016, the entire content of which is hereby incorporated by reference.

BACKGROUND

1. Technical Field

This disclosure relates to a blast fan.

2. Description of the Related Art

A blast fan is an apparatus that generates airflow to be used for cooling, for example, an electronic component. Performance of the blast fan depends on a capacity for causing the airflow to pass through. As the capacity for causing the airflow to pass through is increased, a noise tends to increase. In view of this, various devices are provided for achieving both the performance as the blast fan and the noise reduction.

Japanese Unexamined Patent Application Publication No. 2006-316787 discloses a technique relating the devices. The technique has an object to provide a heat radiation fan, a fan frame structure of the heat radiation fan, and a heat radiation system. The heat radiation fan has a smoothly curved enlarged portion. The curved enlarged portion is configured to reduce a noise generated by a friction of airflow and a frame wall portion of the fan frame. Then, the curved enlarged portion is configured to ensure stabilization and concentration of the airflow to enhance the performance. The fan frame structure of the heat radiation device disclosed in this literature includes a pillar-shaped passage 216 that guides the airflow from one opening to the other opening. Furthermore, the pillar-shaped passage 216 disposed on the at least one opening side has an inner peripheral wall that has a smoothly curved enlarged portion F. The curved enlarged portion F expands in a radial direction and outward (see ABSTRACT).

SUMMARY

A blast fan includes: a tubular frame having a first opening and a second opening to pass airflow through between the first opening and the second opening. The first opening has a first reverse tapered portion expanding from inside to outside of the frame, and the first reverse tapered portion has a surface having first convex portions projecting to the inside of the frame.

DESCRIPTION OF THE EMBODIMENTS

Figure 1:
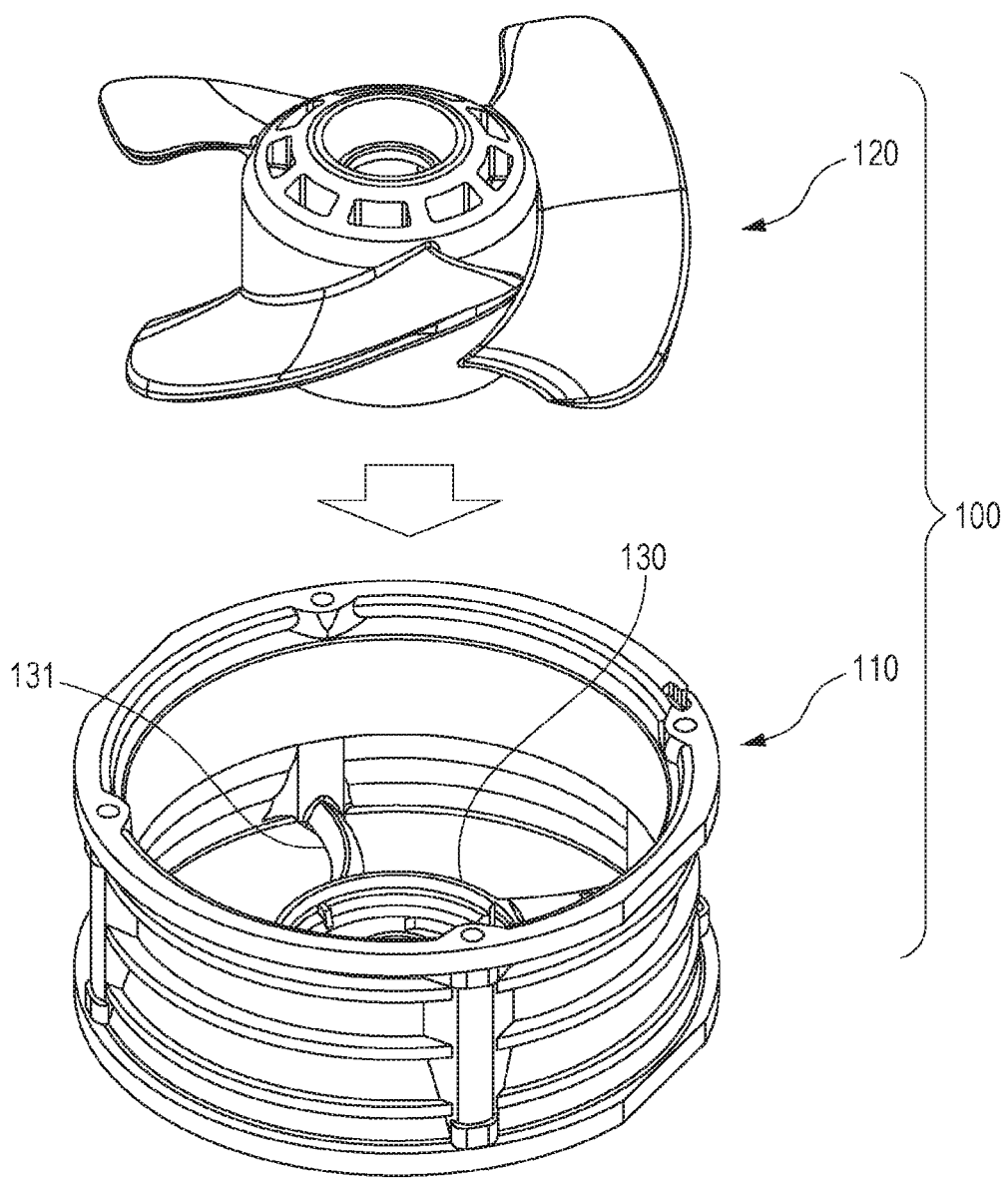
FIG. 1 is a perspective view of a component included in a blast fan.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A blast fan includes a type referred to as a reversible fan or the like. This type of fan rotates a motor in two directions: a normal rotation and a reverse rotation to ensure usage of any of airflows in the two directions. The reversible fan is sometimes desired that a performance during the normal rotation and a performance during the reverse rotation are equivalent. Similarly, it is sometimes preferable that a noise characteristic during the normal rotation and a noise characteristic during the reverse rotation are equivalent characteristics.

The above-described technique disclosed in Japanese Unexamined Patent Application Publication No. 2006-316787 ensures noise reduction. However, it is considered that, in this technique, it is not assumed to rotate the motor in two directions: the normal rotation and the reverse rotation. Accordingly, it is considered that, in the technique disclosed in this document, it is difficult to provide equivalent noise characteristics in any of the normal rotation and the reverse rotation at the reversible fan.

One purpose of this disclosure is to provide a blast fan (a reversible fan) that can make a noise characteristic during a normal rotation and a noise characteristic during a reverse rotation equivalent.

A blast fan according to one aspect of this disclosure includes a reverse taper at an opening, and the reverse taper has a surface having convex portions projecting to an inside of a frame.

That is, a blast fan according to one aspect of this disclosure includes: a tubular frame having a first opening and a second opening to pass airflow through between the first opening and the second opening. The first opening has a first reverse tapered portion expanding from inside to outside of the frame, and the first reverse tapered portion has a surface having first convex portions projecting to the inside of the frame.

The second opening may have a second reverse tapered portion expanding from inside to outside of the frame, and the second reverse tapered portion may have a surface having second convex portions projecting to the inside of the frame.

The blast fan may have a base member for installing a motor. The base member may be arranged at a position close to the first opening with respect to the second opening, the position being in a space inside the frame.

The first reverse tapered portion may be longer than the second reverse tapered portion.

A count of the first convex portions may be larger than a count of the second convex portions.

The blast fan according to the one aspect of this disclosure can make the noise characteristic during the normal rotation and the noise characteristic during the reverse rotation equivalent.

FIG. 1 is a perspective view of a component included in a blast fan 100 according to one embodiment of this disclosure. The blast fan 100 includes a tubular frame 110, a blade 120 housed in the frame 110, and a base member 130. The base member 130, which is a member for installing a motor, is supported to the frame 110 by a spoke 131. The motor is housed in an inside of a center tubular part of the blade 120. The blade 120 is installed on the frame 110 so as to rotate integrally with the motor.

The frame 110 has two openings (a first opening and a second opening). These two respective openings function as a suction port and a discharge port during the normal rotation. For example, the opening (the second opening) illustrated on the upper side in FIG. 1 is the suction port during the normal rotation (the discharge port during the reverse rotation), and the opening (the first opening) illustrated on the lower side in FIG. 1 is the discharge port during the normal rotation (the suction port during the reverse rotation). The base member 130 is, for example, installed on the discharge port side during the normal rotation. In this case, the base member 130 is, for example, arranged at a position close to the first opening with respect to the second opening, the position being in a space inside the frame 110.

As illustrated in FIG. 1, when the base member 130 is disposed on the discharge port side during the normal rotation, the noise characteristic during the normal rotation and the noise characteristic during the reverse rotation are sometimes largely different. Its reason is as follows. The base member 130 is arranged only on the discharge port side during the normal rotation. Thus, a surface shape of the frame 110 when airflow passes through during the normal rotation and a surface shape of the frame 110 when the airflow passes through during the reverse rotation are not symmetrical. Specifically, during the reverse rotation (when the airflow passes through from bottom up in FIG. 1), the airflow sometime collides with the spoke 131 when the airflow flows in the inside of the frame 110 to generate large noise. Therefore, in this embodiment, at an inner wall of the frame 110, a structure that can restrain the noise during the reverse rotation is disposed.

Figure 2A:
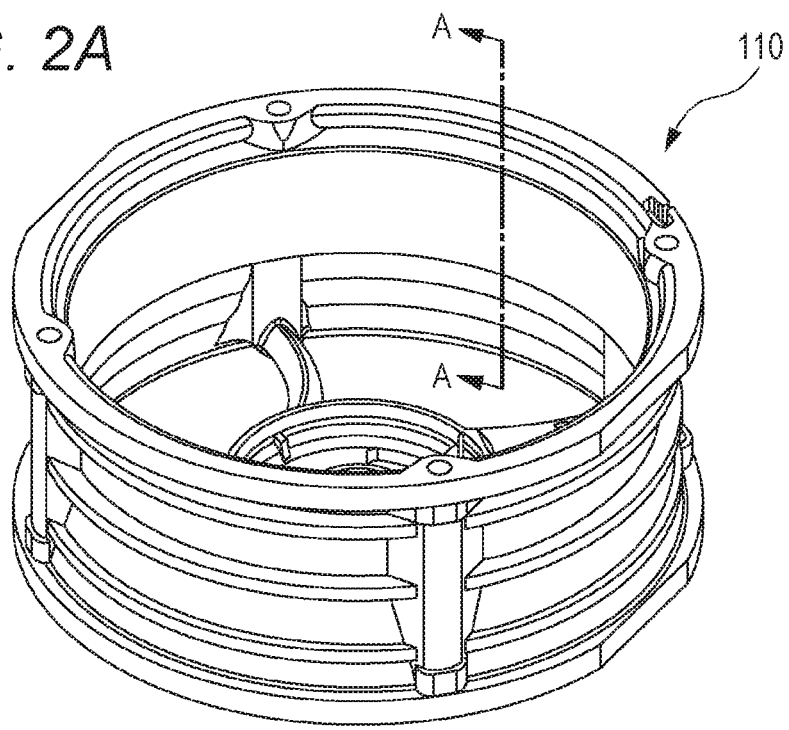
FIGS. 2A and 2B describe a frame in detail.
Figure 2B:
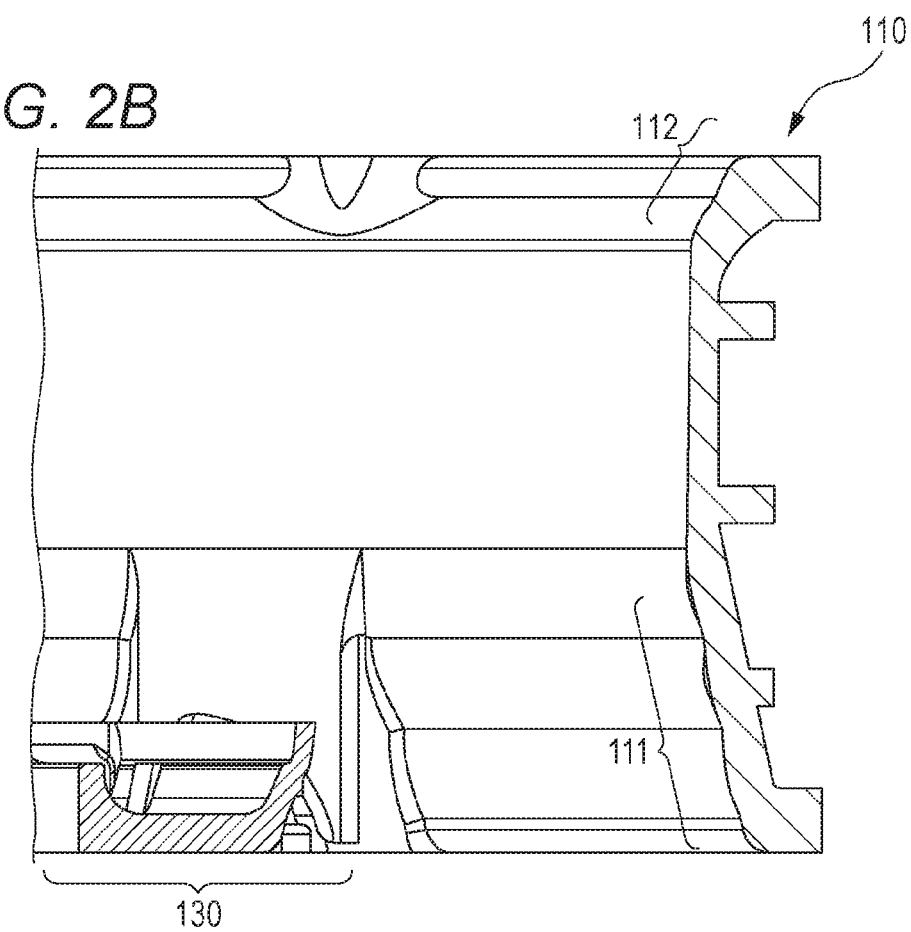

FIGS. 2A and 2B describe the frame 110 in detail. FIG. 2A is a perspective view of the frame 110. FIG. 2B is a cross-sectional view taken along line A-A in FIG. 2A. As illustrated in FIG. 2B, the frame 110 has a first reverse tapered portion 111 and a second reverse tapered portion 112. The first opening (the suction port during the reverse rotation) has the first reverse tapered portion 111. The first reverse tapered portion 111 expands from inside to outside of the frame 110. Accordingly, the first reverse tapered portion 111 expands the suction port during the reverse rotation outside. The second opening (the discharge port during the reverse rotation) has the second reverse tapered portion 112. The second reverse tapered portion 112 expands from inside to outside of the frame 110. Accordingly, the second reverse tapered portion 112 similarly expands the discharge port during the reverse rotation outside.

Figure 3A:
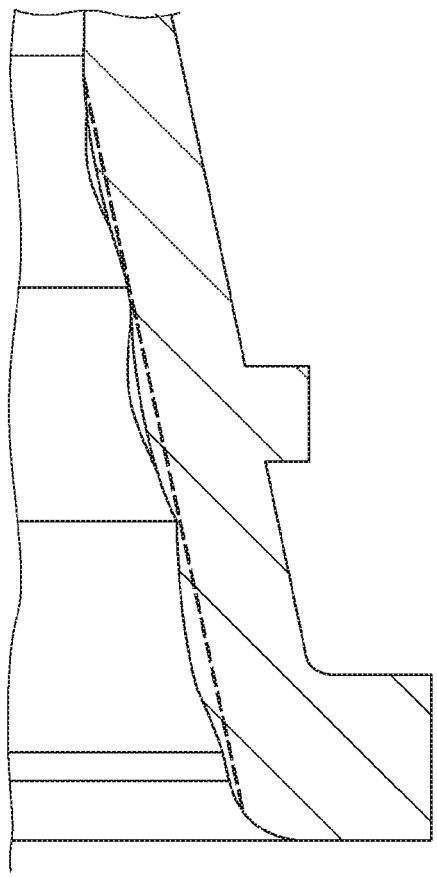
FIGS. 3A and 3B are partially enlarged views of the frame illustrated in FIGS. 2A and 2B.
Figure 3B:
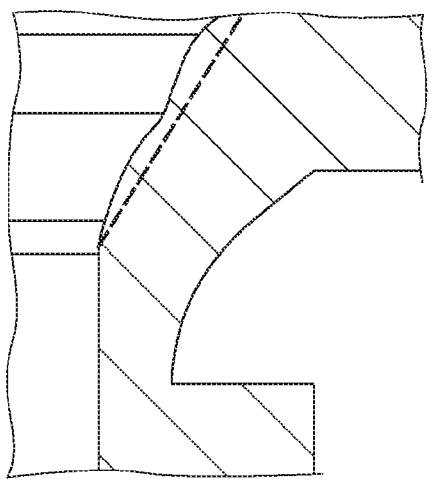

FIGS. 3A and 3B are partially enlarged views of the frame 110 illustrated in FIGS. 2A and 2B. FIG. 3A illustrates an enlarged periphery of the first reverse tapered portion 111. FIG. 3B illustrates an enlarged periphery of the second reverse tapered portion 112. In these drawings, for convenience of explanation, dashed lines are attached. As illustrated in FIGS. 3A and 3B, the first reverse tapered portion 111 has a surface having convex portions (first convex portions) projecting to the inside of the frame 110. As illustrated in FIGS. 2A, 2B, and the like, these convex portions are formed over a whole circumference of the opening (the first opening) that is the suction port during the reverse rotation. The second reverse tapered portion 112 has a surface similarly having convex portions (second convex portions) projecting to the inside of the frame 110. These convex portions are similarly formed over a whole circumference of the discharge port (the second opening) during the reverse rotation.

The convex portions illustrated in FIGS. 3A and 3B have an action that disturbs the airflow passing through the inside of the frame 110 to cancel the noise. In the example illustrated in FIG. 2A, FIG. 2B, FIG. 3A, and FIG. 3B, the first reverse tapered portion 111 is longer than the second reverse tapered portion 112. The first reverse tapered portion 111 has more convex portions than the second reverse tapered portion 112. That is, the number of the convex portions (the first convex portions) of the first reverse tapered portion 111 is larger than the number of the convex portions (the second convex portions) of the second reverse tapered portion 112. In view of this, it is considered that, especially during the reverse rotation (when the airflow passes through from bottom up in the drawing), the first reverse tapered portion 111 has an action that more strongly restrains the noise. Accordingly, it is considered that the noise can be more effectively restrained during the reverse rotation when the noise ordinarily tends to become large compared with during the normal rotation, by arranging the base member 130 on the discharge port side during the normal rotation (the suction port side during the reverse rotation).

Figure 4A:
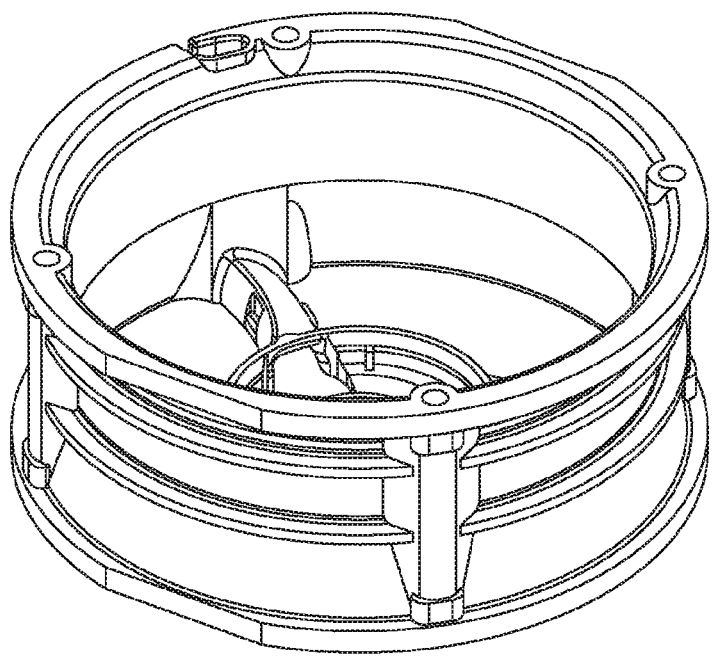
FIGS. 4A and 4B illustrate a shape of a frame where both of a first reverse tapered portion and a second reverse tapered portion do not have convex portions.
Figure 4B:
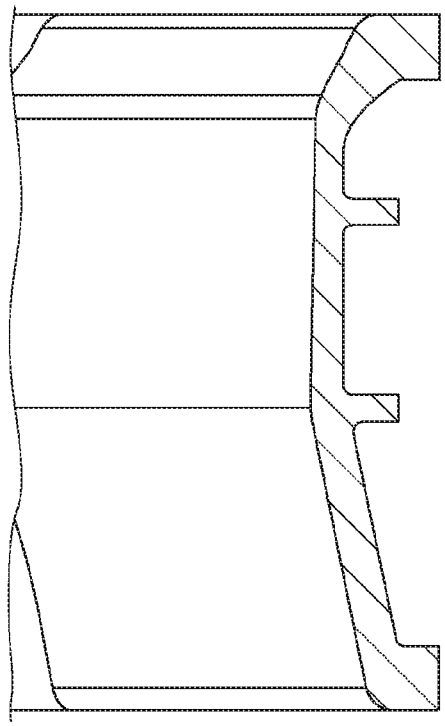

FIGS. 4A and 4B illustrate a shape of a frame where both of the first reverse tapered portion 111 and the second reverse tapered portion 112 do not have the convex portions. FIGS. 4A and 4B correspond to FIGS. 2A and 2B respectively. In order to verify an advantageous effect of the embodiment, the noise characteristics have been compared in each of a blast fan employing the frame shape illustrated in FIGS. 4A and 4B and the blast fan 100 employing the frame 110 according to the embodiment.

Figure 5:
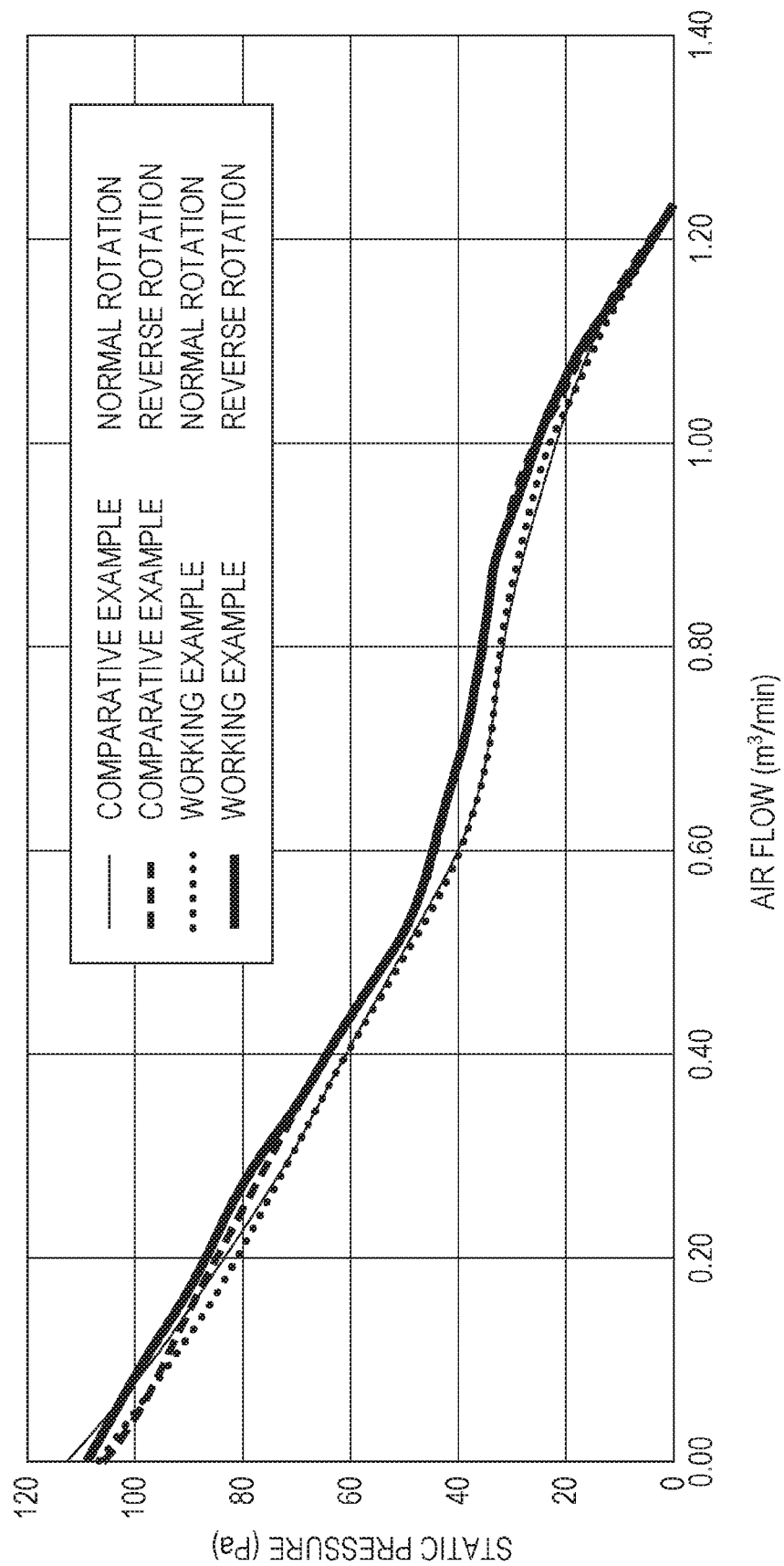
FIG. 5 is a graph that compares respective air volume-static pressure characteristics of a blast fan illustrated in FIGS. 4A and 4B and a blast fan according to an embodiment.

The blast fan (a comparative example) having the frame illustrated in FIGS. 4A and 4B has been made. The blast fan (a working example) according to the embodiment having the frame 110 according to the embodiment has been made. Then, for both of the comparative example and the working example, air volume-static pressure characteristics have been measured. FIG. 5 is a graph that compares the air volume-static pressure characteristics of the blast fan in the comparative example with the air volume-static pressure characteristics of the blast fan in the working example. The thin line in FIG. 5 indicates the air volume-static pressure characteristic of the blast fan (a conventional product) in the comparative example during the normal rotation. The dashed line in FIG. 5 indicates the air volume-static pressure characteristic of the blast fan in the comparative example during the reverse rotation. The dotted line in FIG. 5 indicates the air volume-static pressure characteristic of the blast fan in the working example during the normal rotation. The bold line in FIG. 5 indicates the air volume-static pressure characteristic of the blast fan in the working example during the reverse rotation. As illustrated in FIG. 5, the air volume-static pressure characteristics in the working example and the air volume-static pressure characteristics in the comparative example are approximately identical. That is, the air volume-static pressure characteristics do not almost change depending on whether the convex portions are disposed at the frame or not.

Figure 6:
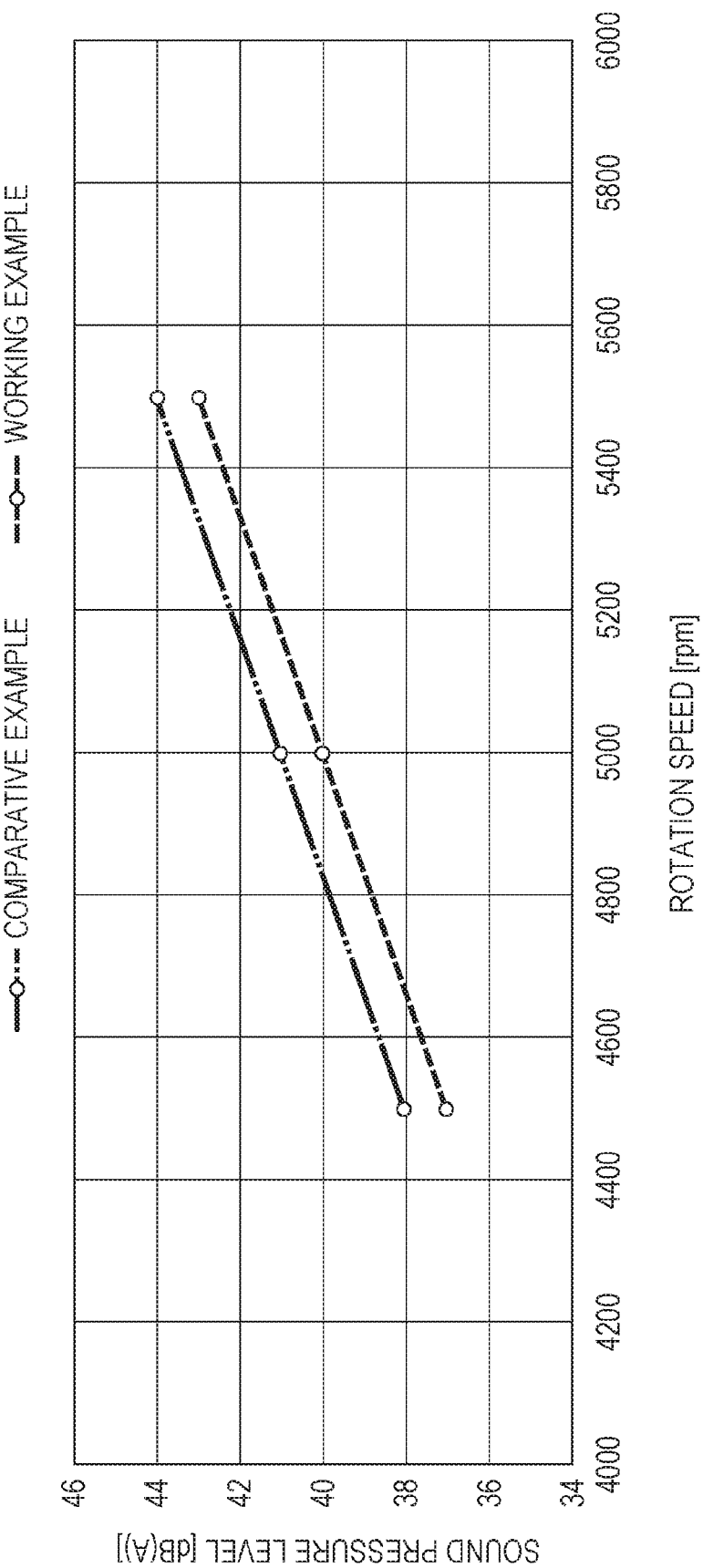
FIG. 6 describes respective sound pressure level characteristics of a conventional blast fan and the blast fan according to the embodiment.

FIG. 6 is a graph that shows a sound pressure level characteristic of the blast fan in the comparative example and a sound pressure level characteristic of the blast fan in the working example. That is, FIG. 6 is a graph that shows a result that sound pressure levels during the reverse rotation of the blast fans in the comparative example and the working example have been measured as changing a rotation speed. The two-dot dashed line in FIG. 6 indicates the sound pressure level characteristic of the blast fan in the comparative example. The dashed line in FIG. 6 indicates the sound pressure level characteristic of the blast fan in the working example.

The following Table 1 shows sound pressure levels (dB) during the normal rotation and sound pressure levels (dB) during the reverse rotation at a certain rotation speed (5300 rpm) of the blast fans in the comparative example and the working example.

TABLE 1

| At 5300 min-1 | Comparative example | Working example |
| --- | --- | --- |
| During normal rotation | 39 dB | 39 dB |
| During reverse rotation | 44 dB | 43 dB |

As shown in Table 1, during the normal rotation, the blast fan in the comparative example and the blast fan in the working example indicate similar sound pressure level characteristics. On the other hand, during the reverse rotation, the blast fan in the working example indicates the sound pressure level characteristic lower than that of the blast fan in the comparative example by 1 dB. As illustrated in FIG. 6, in the sound pressure level characteristics during the reverse rotation, even if the rotation speed is changed, similarly, the blast fan in the working example indicates the sound pressure level characteristics lower than those of the blast fan in the comparative example.

As described above, the blast fan 100 according to the embodiment has the first reverse tapered portion 111 at the discharge port during the normal rotation (the suction port during the reverse rotation). Furthermore, the blast fan 100 has the second reverse tapered portion 112 at the suction port during the normal rotation (the discharge port during the reverse rotation). On the surface of the first reverse tapered portion 111, the convex portions (the first convex portions) are formed. On the surface of the second reverse tapered portion 112, the convex portions (the second convex portions) are formed. This can restrain both of the noise levels during the normal rotation and during the reverse rotation. Furthermore, the noise characteristic during the normal rotation and the noise characteristic during the reverse rotation can be equivalently uniformed.

Modification

The technique in this disclosure is not limited to the above-described embodiment and working example. The technique in this disclosure includes various modifications. For example, the above-described embodiment and working example are described in detail for easily understanding the technique in this disclosure. They do not necessarily include all the described configurations.

In the above-described embodiment, the first reverse tapered portion 111 and the second reverse tapered portion 112 both have the convex portions over the whole circumference of the frame 110. However, the first reverse tapered portion 111 and the second reverse tapered portion 112 are not limited to this. The first reverse tapered portion 111 and the second reverse tapered portion 112 may have the convex portions only at a part of the circumferential direction of the frame 110. Even in this case, the blast fan 100 can provide appropriate advantageous effect.

In the above-described embodiment, both of the suction port and the discharge port (the first reverse tapered portion 111 and the second reverse tapered portion 112) have the convex portions. However, even when any one of the suction port and the discharge port (the first reverse tapered portion 111 and the second reverse tapered portion 112) has the convex portions, the blast fan 100 can provide appropriate advantageous effect. For example, when the base member 130 is arranged on the discharge port side during the normal rotation (the suction port side during the reverse rotation), while the convex portions are disposed on the surface of the first reverse tapered portion 111, the convex portions may be omitted at the second reverse tapered portion 112. This can restrain the noise during the reverse rotation. Alternatively, for example, corresponding to environment and the like of a position where the blast fan 100 is installed, the noise level during the normal rotation is sometimes larger than the noise level during the reverse rotation. In this case, while the convex portions are disposed on the surface of the second reverse tapered portion 112, the convex portions may be omitted at the first reverse tapered portion 111.

The embodiment in this disclosure may be the following first to fifth blast fans.

The first blast fan is a blast fan that generates airflow, and includes a tubular frame that has a first opening and a second opening to pass the airflow through between the first opening and the second opening. The first opening has a first reverse tapered portion expanding from inside to outside of the frame. The first reverse tapered portion has a surface having first convex portions projecting to the inside of the frame.

The second blast fan is the first blast fan. The second opening has a second reverse tapered portion expanding from inside to outside of the frame. The second reverse tapered portion has a surface having second convex portions projecting to the inside of the frame.

The third blast fan is the second blast fan, and further includes a base member on which a motor is installed. The base member is arranged at a position close to the first opening with respect to the second opening, the position being in a space inside the frame.

The fourth blast fan is the third blast fan. The first reverse tapered portion is longer than the second reverse tapered portion.

The fifth blast fan is the third blast fan. A count of the first convex portions is larger than a count of the second convex portions.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A blast fan comprising:

a blade configured to rotate integrally with a motor;

a tubular frame having a first opening and a second opening to pass airflow through between the first opening and the second opening, the first opening being a discharge port during a normal rotation of the blade in which the airflow passes through the tubular frame from the second opening to the first opening and a suction port during a reverse rotation of the blade in which the airflow passes through the tubular frame from the first opening to the second opening, the second opening being a suction port during the normal rotation of the blade and a discharge port during the reverse rotation of the blade; and a base member for installing the motor located at a position close to the first opening with respect to the second opening, the position being in a space inside the tubular frame, both the base member and the motor being fixed to the tubular frame, wherein:

the first opening has a first reverse tapered portion expanding from inside to outside of the tubular frame, the first reverse tapered portion has a surface having first convex portions projecting to the inside of the tubular frame, a maximum diameter of the first reverse tapered portion is at an outermost end of the first opening in a direction of the airflow during the normal rotation, the second opening has a second reverse tapered portion expanding from inside to outside of the tubular frame, the second reverse tapered portion has a surface having second convex portions projecting to the inside of the tubular frame, and there are fewer second convex portions than first convex portions.

2. The blast fan according to claim 1, wherein
the first reverse tapered portion is longer than the second reverse tapered portion.

3. The blast fan according to claim 1, wherein the first convex portions are spaced in an axial direction of the tubular frame, and the first convex portions are provided to a whole circumference of the tubular frame.

4. The blast fan according to claim 1, wherein the second convex portions are spaced in an axial direction of the tubular frame, and the second convex portions are provided to a whole circumference of the tubular frame.

5. The blast fan according to claim 1, wherein the first convex portions are spaced in an axial direction of the tubular frame, and the first convex portions are provided to a whole circumference of the first opening, and the second convex portions are spaced in the axial direction, and the second convex portions are provided to a whole circumference of the second opening.

* * * * *